United States Patent
Rhee

(10) Patent No.: US 6,365,941 B1
(45) Date of Patent: Apr. 2, 2002

(54) ELECTRO-STATIC DISCHARGE CIRCUIT OF SEMICONDUCTOR DEVICE, STRUCTURE THEREOF AND METHOD FOR FABRICATING THE STRUCTURE

(75) Inventor: Tae-Pok Rhee, Uiwang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/401,201

(22) Filed: Sep. 22, 1999

(30) Foreign Application Priority Data

Sep. 29, 1998 (KR) .......................................... 98-40473

(51) Int. Cl.$^7$ .............................................. H01L 23/62
(52) U.S. Cl. ...................... 257/357; 257/328; 257/351; 257/355; 257/356; 257/546; 438/212; 438/223; 438/224; 438/227; 438/268
(58) Field of Search .................................. 257/328, 351, 257/355, 356, 357, 546; 438/212, 223, 224, 227, 228, 268

(56) References Cited

U.S. PATENT DOCUMENTS

| | | | |
|---|---|---|---|
| 5,416,351 A | | 5/1995 | Ito et al. |
| 5,426,320 A | * | 6/1995 | Zambrano .................. 257/328 |
| 5,610,089 A | * | 3/1997 | Iwai et al. ..................... 437/34 |
| 5,623,387 A | * | 4/1997 | Li et al. ......................... 361/56 |
| 5,654,574 A | * | 8/1997 | Williams et al. ............. 257/355 |
| 5,886,381 A | * | 3/1999 | Frisna ........................ 257/328 |
| 5,891,792 A | * | 4/1999 | Shih et al. ................... 138/525 |
| 5,982,600 A | * | 11/1999 | Cheng ........................ 361/111 |

FOREIGN PATENT DOCUMENTS

| | | | | |
|---|---|---|---|---|
| EP | 0774785 A2 | * | 11/1996 | .......... H01L/27/02 |
| JP | 7086585 | | 2/1997 | |
| KR | 0066053 | | 7/1997 | |

* cited by examiner

Primary Examiner—Eddie Lee
Assistant Examiner—Matthew E. Warren
(74) Attorney, Agent, or Firm—F. Chau & Associates, LLP

(57) ABSTRACT

An electro-static discharge (ESD) circuit of a semiconductor device, a structure thereof and a method for fabricating the ESD structure are provided. In the ESD circuit, a gate electrode and a drain region of a MOS transistor are connected to an electrical signal pad, and a Zener diode is connected to a source region of the MOS transistor. A threshold voltage of the MOS transistor is higher than an operating voltage of an internal circuit and lower than a drain junction breakdown voltage of a MOS transistor constituting the internal circuit. Also, instead of using a Zener diode for each signal pad, a common diode having a maximized junction area can be shared by a plurality of signal pads.

49 Claims, 10 Drawing Sheets

ELECTRO-STATIC DISCHARGE CIRCUIT OF SEMICONDUCTOR DEVICE, STRUCTURE THEREOF AND METHOD FOR FABRICATING THE STRUCTURE

FIELD OF THE INVENTION

The present invention relates to an electro-static discharge (ESD) circuit, and more particularly to an enhanced ESD circuit, a structure thereof and a method for fabricating the structure.

DESCRIPTION OF THE RELATED ART

A semiconductor device includes, in general as a protection circuit, an electro-static discharge circuit which enables it to temporarily withstand a large amount of externally applied voltage (for example, several thousand volts). An electro-static discharge circuit is interposed between a pad and an internal circuit of a semiconductor device. When a voltage exceeding an appropriate operating range is applied to a pad of a semiconductor device, an electro-static discharge circuit protects an internal circuit of the semiconductor device by allowing electrostatic charge induced in the pad to bypass the internal circuit through a power pad (Vcc pad) or a ground pad.

When a voltage of several thousands volts is momentarily applied to a pad, a large amount of electro-static charge is generated. If the electro-static charge does not rapidly by-pass the internal circuit, damage occurs to the internal circuit. Thus, conventionally, a diode is formed between a pad and a semiconductor substrate, and the electro-static charge induced in the pad is discharged by using a reverse breakdown current of the diode. Here, if a junction area of the diode is small, current density of the electro-static charge discharging through the junction of the diode increases. As a result, the junction of the diode is susceptible to damage.

Thus, a conventional ESD circuit requires a diode having a very large junction area. Also, in conventional ESD circuits, if the reverse breakdown current is greater than a predetermined current level, the junction of the diode is easily damaged. Therefore, in an ESD circuit adopting a general diode, it is difficult to improve the characteristics of the ESD circuit unless the junction area of the diode is maximized. In particular, semiconductor devices for driving liquid crystal display devices use a high operating voltage of 10 volts or higher, unlike conventional semiconductor memory devices. Thus, a high voltage semiconductor device using a high operating voltage of 10 volts or higher should have a breakdown voltage of a source/drain region of a MOS transistor higher than the operating voltage. Accordingly, it is desirable to minimize impurity concentrations of the source/drain region and a well in which the MOS transistor is formed. However, it is typical for a junction diode used in an ESD circuit of a high voltage semiconductor device to be simultaneously formed with a source/drain region of a MOS transistor.

FIG. 20 is an equivalent circuit diagram of a conventional ESD circuit. Referring to FIG. 20, a diode CD is interposed between a pad P and a grounded semiconductor substrate. A P-type electrode and an N-type electrode of the diode CD are connected to a ground terminal and the pad P, respectively. Also, the pad P is connected to an internal circuit. Here, a reverse breakdown voltage of the diode CD must be higher than an operating voltage of the internal circuit. Thus, if a voltage lower than the operating voltage of the internal circuit and higher than a ground voltage is applied to the pad P, the voltage applied to the pad P makes the internal circuit operate normally. In this way, if a voltage higher than the operating voltage of the internal circuit or a negative voltage is applied to the pad P, charges induced in the pad P are by-passed through the diode CD. Accordingly, the internal circuit can be protected from excessive currents.

FIG. 21 is a vertical sectional view of a structure in which the ESD circuit in FIG. 20 is implemented in a semiconductor substrate. Referring to FIG. 21, isolation layers 303 defining active regions are formed in predetermined regions of a semiconductor substrate 301. For example, a P-type semiconductor substrate, an impurity region doped with impurities of a conductivity type opposite to that of the semiconductor substrate 301, i.e., an N-type impurity region, is formed in one of the active regions between the isolation layers 303. The N-type impurity region consists of a heavily doped N-type impurity region 307 and a lightly doped N-type impurity region 305 surrounding the heavily doped N-type impurity region 307. The N-type impurity region is simultaneously formed with a source/drain region of a high voltage NMOS transistor. Also, an impurity region doped with impurities of the same conductivity as that of the semiconductor substrate 301, that is, a P-type impurity region 309, is formed in an active region adjacent to the N-type impurity region. The P-type impurity region 309 serves as a pick-up area for applying a bias voltage, i.e., a ground potential, to the semiconductor substrate 301. The isolation layers 303 and the active regions are covered by an interlayer dielectric film. The heavily doped N-type impurity region 307 constituting the N-type impurity region is connected to a pad electrode 313P passing through a predetermined area of the interlayer dielectric film 311, and the P-type impurity region 309 is connected to ground pads 313G passing through a predetermined area of the interlayer dielectric film 311. Therefore, the N-type impurity region and the semiconductor substrate 301 correspond to an N-type electrode and a P-type electrode of the diode CD shown in FIG. 20, respectively.

According to the above-described conventional technology, the characteristics of an ESD circuit are directly affected by a junction area of a diode. As the area where the N-type impurity region and the semiconductor substrate contact is increased, the electro-static discharge characteristics, that is, the ESD voltages, increase. However, the integration density of a semiconductor device is relatively reduced.

Therefore, in a conventional ESD circuit of a semiconductor device, it is desired to improve the electrostatic discharge characteristics of the ESD circuit without rendering the integration density of the semiconductor device reduced.

SUMMARY OF THE INVENTION

To solve the above and other problems, it is an object of the present invention to provide an electrostatic discharge circuit of a semiconductor device which can protect a junction diode connected to a pad from being damaged.

It is another object of the present invention to provide a structure of the electro-static discharge circuit.

It is still another object of the present invention to provide a method for fabricating the structure of the electro-static discharge circuit.

Accordingly, to achieve the first object, the present invention provides an electro-static discharge (ESD) circuit of a semiconductor device having a ground pad, a power pad, a plurality of electrical signal pads and an internal circuit, the ESD circuit including at least one MOS transistor having a gate electrode and a drain region connected to each of the electrical signal pads; and a Zener diode connected to a source region of the at least one MOS transistor.

According to another aspect of the present invention, there is provided an electro-static discharge (ESD) circuit of a semiconductor device having a ground pad, a power pad, a plurality of electrical signal pads and a plurality of internal circuits each having an input terminal, the ESD circuit including a MOS transistor having a gate electrode and a drain region connected to each of the electrical signal pads, and a common diode connected to a source region of the MOS transistor.

To achieve the second object, the present invention provides an electro-static discharge (ESD) structure of a semiconductor device including a gate electrode formed on a predetermined area of a semiconductor substrate of a first conductivity type, a lightly doped source region of a second conductivity type and a lightly doped drain region of the second conductivity type which are formed in the semiconductor substrate at both sides of the gate electrode, respectively, a heavily doped degenerated source region of the second conductivity type surrounded by the lightly doped source region, a heavily doped degenerated drain region of the second conductivity type surrounded by the lightly doped drain region, and a degenerated pick-up region of the first conductivity type contacting the edges of the heavily doped degenerated source region and the semiconductor substrate.

According to another aspect of the present invention, there is provided an electro-static discharge (ESD) structure of a semiconductor device including a gate electrode formed on a predetermined area of a semiconductor substrate of a first conductivity type, a lightly doped source region of a second conductivity type and a lightly doped drain region of the second conductivity type which are formed in the semiconductor substrate at both sides of the gate electrode, respectively, a heavily doped source region of the second conductivity type surrounded by the lightly doped source region and a heavily doped drain region of the second conductivity type surrounded by the lightly doped drain region, a well region of the second conductivity type formed in the semiconductor substrate around the lightly doped source region, a well pick-up region of the second conductivity type surrounded by the well region of the second conductivity type, a signal pad electrode for electrically connecting the heavily doped drain region and the gate electrode, and an interconnection for electrically connecting the heavily doped source region and the well pick-up region.

To achieve the third object, the present invention provides a method for fabricating an electro-static discharge (ESD) structure of a semiconductor device including the steps of forming a gate electrode on a predetermined area of a semiconductor substrate of a first conductivity type, forming a lightly doped source region of a second conductivity type and a lightly doped drain region of the second conductivity type in the semiconductor substrate at both sides of the gate electrode, respectively, forming a heavily doped degenerated source region of the second conductivity type surrounded by the lightly doped source region, forming a heavily doped degenerated drain region of the second conductivity type surrounded by the lightly doped drain region, and forming a degenerated pick-up region of the first conductivity type contacting edges of the heavily doped degenerated source region and the semiconductor substrate.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
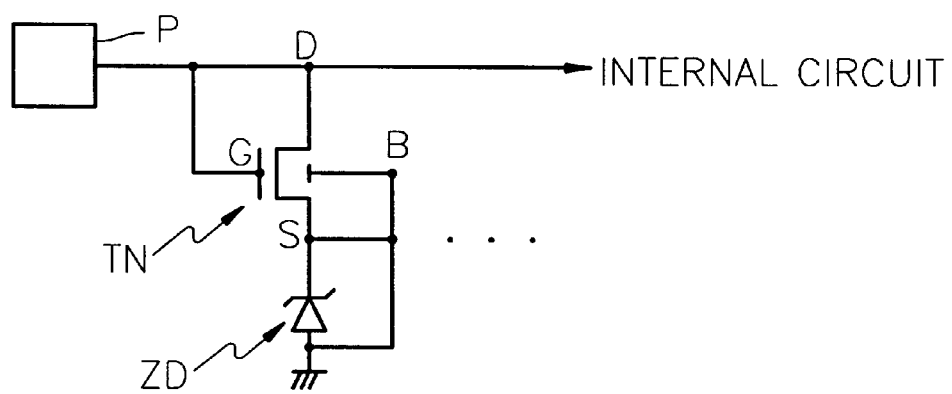
FIG. 1 is an equivalent circuit diagram illustrating an electro-static discharge circuit according to a first embodiment of the present invention.

FIGS. 1 through 4 are equivalent circuit diagrams of electro-static discharge circuits according to the present invention. Referring to FIG. 1, at least one NMOS transistor TN and a Zener diode ZD serially connected to each other, are interposed between a signal pad P for transmitting an electrical signal to an internal circuit of a semiconductor device and a ground pad. A gate electrode G and a drain region D of the NMOS transistor TN are connected to the signal pad P, and a source region S of the NMOS transistor TN is connected to an N-type region of the Zener diode ZD.

Also, a bulk region B of the NMOS transistor TN and a P-type region of the Zener diode ZD are connected to the ground pad. Here, the source region S of the NMOS transistor TN may be connected to the ground pad. A threshold voltage of the NMOS transistor TN is higher than an operating voltage of the internal circuit and lower than a drain junction breakdown voltage of a NMOS transistor constituting the internal circuit. Also, a drain junction breakdown voltage of the NMOS transistor TN is higher than the operating voltage of the internal circuit. Here, the NMOS transistor TN may be a field transistor having an isolation layer interposed between the gate electrode G and the bulk region B, or a general active transistor.

Now, operations of the electrostatic discharge circuit shown in FIG. 1 will be described. When a normal voltage, a voltage lower than the operating voltage of the internal circuit and higher than the ground voltage, is applied to the signal pad P, the NMOS transistor TN is turned off. Thus, the normal voltage applied to the signal pad P operates the internal circuit. However, when a voltage higher than both the operating voltage of the internal circuit and the threshold voltage of the NMOS transistor TN is applied to the signal pad P, the NMOS transistor TN is turned on. Thus, the voltage applied to the signal pad P is temporarily applied to the source region S of the NMOS transistor TN. Thus, a tunneling current flows through the Zener diode ZD due to a high voltage temporarily induced in the source region. Here, the tunneling current density of the Zener diode ZD is generally higher than a reverse breakdown current density of a junction diode of the NMOS transistor TN. Also, when a tunneling phenomenon occurs due to a reverse bias applied to the Zener diode ZD, no damage is applied to the junction of the Zener diode ZD. Even if a voltage higher than the operating voltage of the internal circuit is applied to the signal pad P, the amount of the current which can be by-passed through the Zener diode ZD is larger than that of the current which can be by-passed through a conventional junction diode. Accordingly, the junction of the Zener diode ZD can be protected from damages. Therefore, the electrostatic charges induced by a high voltage applied to the signal pad P can be passed by the electro-static discharge circuit to a ground pad without damages.

When a voltage lower than the ground voltage is applied to the signal pad P, a forward bias is applied between the bulk region B and the drain region D. Thus, in this case, a forward current flows through a diode consisting of the drain region D and the bulk region B.

As described above, according to the ESD circuit shown in FIG. 1, the ESD circuit characteristics can be improved by using a Zener diode and an NMOS transistor having a threshold voltage higher than the operating voltage of the internal circuit.

Figure 2:
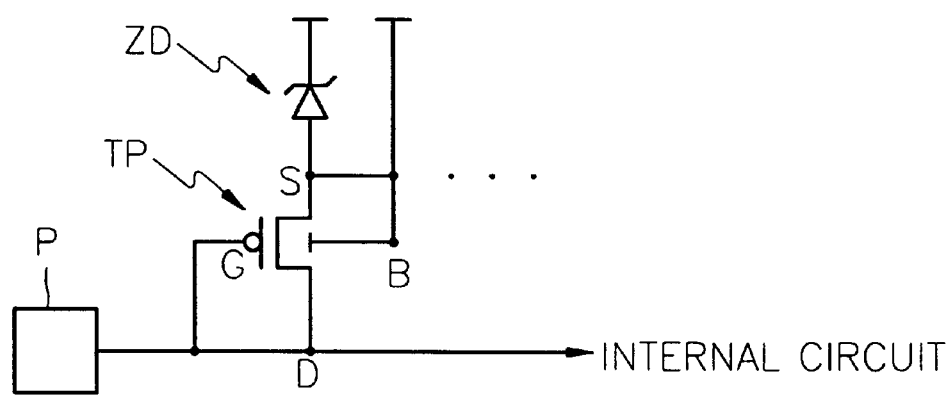
FIG. 2 is an equivalent circuit diagram illustrating an electro-static discharge circuit according to a second embodiment of the present invention.

FIG. 2 shows an ESD circuit using a PMOS transistor TP instead of a NMOS transistor, for instance, in FIG. 1. Referring to FIG. 2, at least one PMOS transistor TP and a Zener diode ZD serially connected to each other, are interposed between a signal pad P for transmitting an electrical signal to the internal circuit of a semiconductor device and a power pad. A gate electrode G and a drain region D of the PMOS transistor TP are connected to the signal pad P, and a source region S of the PMOS transistor TP is connected to a P-type region of the Zener diode ZD. Also, a bulk region B of the PMOS transistor TP and an N-type region of the Zener diode ZD are connected to the power pad. Here, the source region S of the PMOS transistor TP may be connected to the power pad. An absolute value of a threshold voltage of the PMOS transistor TP is higher than an operating voltage of the internal circuit and lower than a drain junction breakdown voltage of a MOS transistor constituting the internal circuit. Also, an absolute value of a drain junction breakdown voltage of the PMOS transistor TP is higher than the operating voltage of the internal circuit. Here, the PMOS transistor TP may be a field transistor having an isolation layer interposed between the gate electrode G and the bulk region B, or a general active transistor.

The operational principle of the electrostatic discharge circuit shown in FIG. 2 is the same as that of the electrostatic discharge circuit shown in FIG. 1. When a normal voltage, a voltage within a range between the operating voltage of the internal circuit and the ground voltage, is applied to the signal pad P, the PMOS transistor TP is turned off. Thus, the voltage applied to the signal pad P is transmitted to the internal circuit. However, when a voltage higher than the operating voltage of the internal circuit is applied to the signal pad P, a forward bias voltage is applied between the bulk region B and the drain region D of the PMOS transistor TP. Thus, the electro-static charges induced in the signal pad P are by-passed through the power pad, thereby preventing damage to the internal circuit. Also, when a negative voltage, a voltage lower than the threshold voltage of the PMOS transistor TP, is applied to the signal pad P, the PMOS transistor TP is turned on. Thus, since a tunneling current flows through the Zener diode, the internal circuit can be protected.

Figure 3:
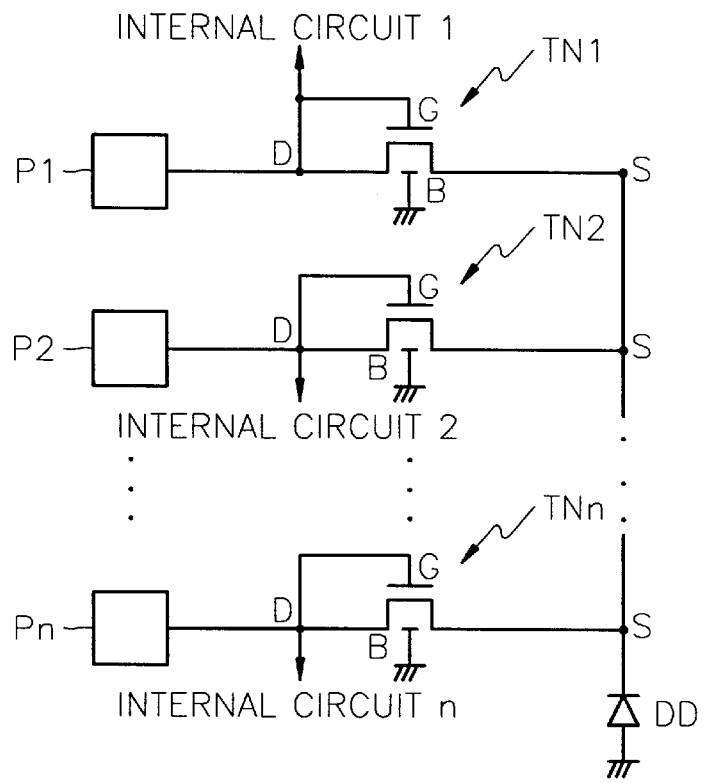
FIG. 3 is an equivalent circuit diagram illustrating an electro-static discharge circuit according to a third embodiment of the present invention.
Figure 4:
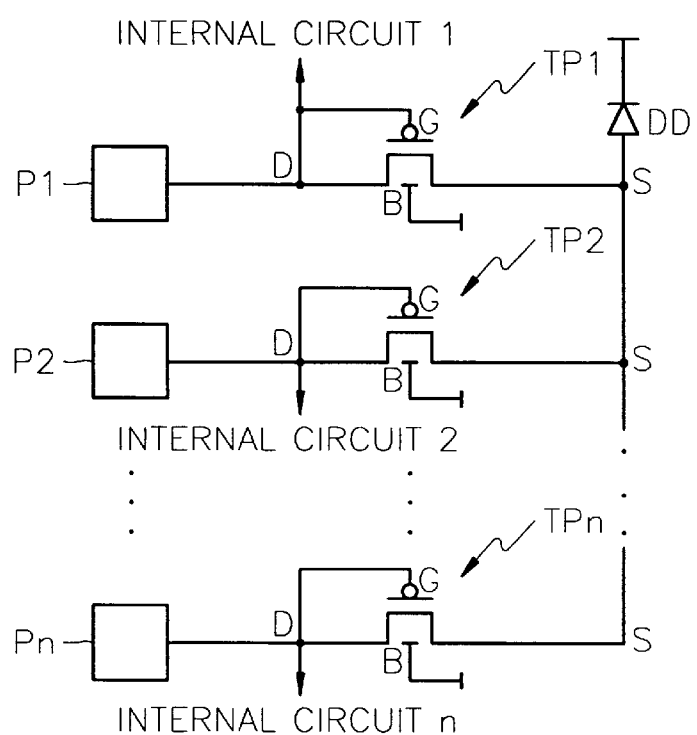
FIG. 4 is an equivalent circuit diagram illustrating an electro-static discharge circuit according to a fourth embodiment of the present invention.

FIGS. 3 and 4 show ESD circuits in which internal circuits are protected by using a common diode shared by a plurality of signal pads. Here, the common diode is a general diode having a large junction area for reducing the reverse breakdown current density.

Referring to FIG. 3, n NMOS transistors TN1, TN2, . . . and TNn and a common diode DD are interposed between n signal pads P1, P2, . . . and Pn and a ground pad. In detail, a gate electrode G and a drain region D of a first NMOS transistor TN1 are connected to a first signal pad P1, and a source region S of the first NMOS transistor TN1 is connected to an N-type region of the common diode DD. Also, a gate electrode G and a drain region D of a second NMOS transistor TN2 are connected to a second signal pad P2, and a source region S of the second NMOS transistor TN2 is connected to the N-type region of the common diode DD. Likewise, a gate electrode G and a drain region D of an n-th NMOS transistor TNn are connected to an n-th signal pad Pn, and a source region S of the n-th NMOS transistor TNn is connected to the N-type region of the common diode DD. Drain regions of the first through n-th NMOS transistors TN1, TN2, . . . and TNn are connected to input terminals of the first through n-th internal circuits, respectively, and bulk regions B of the respective transistors are connected to the ground pad. A P-type region of the common diode DD is connected to the ground pad. The respective NMOS transistors may be field transistors each having an isolation layer interposed between the gate electrode G and the bulk region B, or general active transistors. Threshold voltages of the respective NMOS transistors TN1, TN2, . . . and TNn are higher than operating voltages of the internal circuits and lower than drain junction breakdown voltages of MOS transistors constituting the internal circuits. Also, drain junction breakdown voltages of the respective NMOS transistors TN1, TN2, . . . and TNn are higher than the operating voltages of the respective internal circuits. A junction area of the common diode DD is preferably wider than that of a junction diode of a conventional ESD circuit. Here, since the plurality of signal pads share a common diode, an increase in a chip area of a semiconductor device can be avoided.

Now, operations of the ESD circuit shown in FIG. 3 will be described.

First, when normal voltages, voltages lower than the operating voltages of the respective internal circuits and higher than a ground voltage, are applied to the plurality of signal pads P1, P2, . . . and Pn, the NMOS transistors TN1, TN2 . . . and TNn are turned off. Thus, the normal voltages applied to the respective signal pads normally operate the respective internal circuits. However, when a voltage higher than the operating voltages of the respective internal circuits and higher than threshold voltages of the NMOS transistors (for example, a high voltage of several hundreds to several thousands volts) is applied to at least one of the plurality of signal pads, the NMOS transistor connected to the specific signal pad provided with the high voltage is turned on. Thus, the high voltage applied to the specific signal pad is temporarily applied to the source region S of the NMOS transistor connected to the specific signal pad. Thus, a reverse breakdown current flows through the common diode DD due to a high voltage temporarily induced in the source region. Here, density of the reverse breakdown current flowing the common diode DD is generally lower than that in a conventional ESD circuit. As a result, damage to the junction of the common diode DD can be prevented. Also, when a voltage lower than the ground voltage is applied to a specific signal pad among the plurality of signal pads, a forward bias voltage is applied between a bulk region B and a drain region D of an NMOS transistor connected to the specific signal pad. As a result, damages to the internal circuit connected to the specific signal pad can be prevented.

As described above, according to the ESD circuit shown in FIG. 3, the ESD circuit characteristics can be improved by using a common diode having a junction area larger than that in the prior art and NMOS transistors each having a threshold voltage higher than the operating voltage of the internal circuit.

FIG. 4 shows an ESD circuit using a plurality of PMOS transistors, instead of the NMOS transistors shown in FIG. 3. Referring to FIG. 4, n PMOS transistors TP1, TP2, . . . and TPn and a common diode DD are interposed between n signal pads P1, P2, . . . and Pn and a power pad. In detail, a gate electrode G and a drain region D of a first PMOS transistor TP1 are connected to a first signal pad P1, and a source region S of the first PMOS transistor TP1 is connected to a P-type region of the common diode DD. Also, a gate electrode G and a drain region D of a second PMOS transistor TP2 are connected to a second signal pad P2, and a source region S of the second PMOS transistor TP2 is connected to the P-type region of the common diode DD. Likewise, a gate electrode G and a drain region D of an n-th PMOS transistor TPn are connected to an n-th signal pad Pn, and a source region S of the n-th PMOS transistor TPn is connected to the P-type region of the common diode DD. Drain regions of the first through n-th PMOS transistors TP1, TP2, . . . and TPn are connected to input terminals of the first through n-th internal circuits, respectively, and bulk regions B of the respective PMOS transistors are connected to the power pad. An N-type region of the common diode DD is connected to the power pad. The respective PMOS transistors may be field transistors each having an isolation layer interposed between the gate electrode G and the bulk region B, or general active transistors. Here, absolute values of threshold voltages of the respective PMOS transistors are higher than operating voltages of the internal circuits and lower than drain junction breakdown voltages of MOS transistors constituting the internal circuits. Also, absolute values of drain junction breakdown voltages of the respective PMOS transistors are higher than the operating voltages of the respective internal circuits. A junction area of the common diode DD is preferably wider than that of a junction diode of a conventional ESD circuit, as described in FIG. 3. Here, since the plurality of signal pads share a common diode, an increase in the chip area of a semiconductor device can be avoided.

The operational principle of the electro-static discharge circuit shown in FIG. 4 is the same as that of the electrostatic discharge circuit shown in FIG. 3, and a detailed explanation thereof will be omitted.

FIGS. 5 through 8 are vertical sectional views illustrating structures in which the electro-static discharge circuit shown in FIG. 1 or 2 is implemented in a semiconductor substrate.

Figure 5:
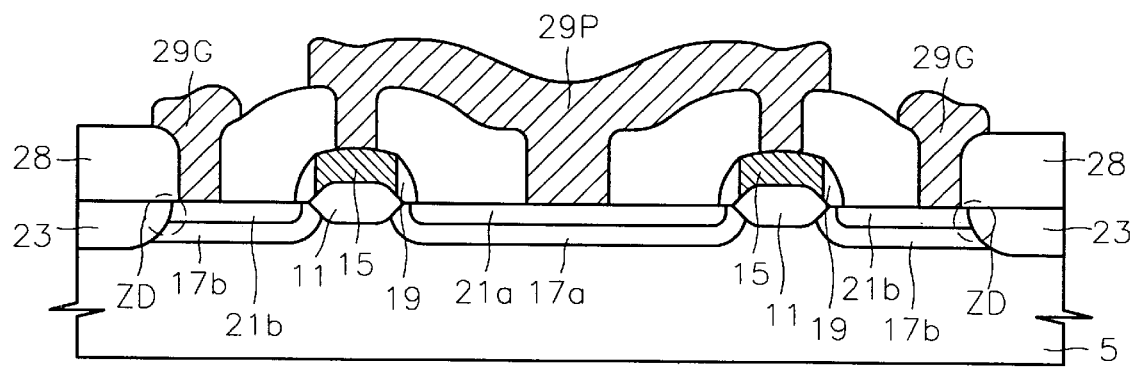
FIG. 5 is a vertical sectional view illustrating a structure in which the electro-static discharge circuit shown in FIG. 1 or 2 is implemented in a semiconductor substrate.

Referring to FIG. 5, an isolation layer 11 is formed to define an active region in a predetermined region of a semiconductor substrate 5 of a first conductivity type, and a gate electrode 15 is formed on the isolation layer 11. The first conductivity type semiconductor substrate 5 may be a well of a first conductivity type. A lightly doped drain region 17a of a second conductivity type and a lightly doped source region 17b of a second conductivity type are formed in the semiconductor substrate 5 at both sides of the gate electrode 15, respectively. A heavily doped drain region 21a of the second conductivity type and a heavily doped source region 21b of the second conductivity type are formed at the surfaces of the lightly doped drain region 17a and the lightly doped source region 17b, respectively. Thus, the heavily doped drain region 21a and the heavily doped source region 21b are surrounded by the lightly doped drain region 17a and the lightly doped source region 17b, respectively. The lightly doped drain region 17a and the heavily doped drain region 21a form a drain region, and the lightly doped source region 17b and the heavily doped source region 21b form a source region. The lightly doped source and drain regions 17b and 17a may be simultaneously formed with source and drain regions (not shown) of a high voltage MOS transistor constituting an internal circuit. Also, a spacer 19 may be formed at both side walls of the gate electrode 15. It is preferred that the heavily doped drain region 21a and the heavily doped source region 21b are doped to a concentration high enough to form degenerated impurity regions of the second conductivity type. A degenerated pick-up region 23 of the first conductivity type is formed around the edge of the heavily doped source region 21b. The bottom of the pick-up region 23 contacts the semiconductor substrate 5. The heavily doped source region 21b and the pick-up region 23 constitute a Zener diode ZD. The gate electrode 15 and the source and drain regions at both sides of the gate electrode 15 constitute a field transistor. The first conductivity type and the second conductivity type are a P-type or an N-type, respectively, or vice versa. Here, a threshold voltage of the field transistor is higher than an operating voltage of the internal circuit and lower than a drain breakdown voltage of a MOS transistor constituting the internal circuit. Also, a drain breakdown voltage of the field transistor is higher than the operating voltage of the internal circuit.

The semiconductor substrate 5 having the field transistor and the Zener diode ZD is covered with an interlayer dielectric film 28. The heavily doped drain region 21a and the gate electrode 15 are electrically connected to each other by a signal pad electrode 29P through a contact hole produced by etching a predetermined area of the interlayer dielectric film 28. The signal pad electrode 29P is connected to a signal pad (for example, P of FIG. 1 or 2) for applying an electrical signal to the internal circuit of the semiconductor device. The heavily doped source region 21b contacts an electrode 29G through a contact hole produced by etching a predetermined area of the interlayer dielectric film 28. In the case where the first conductivity type and the second conductivity type are a P-type and an N-type, respectively, the electrode 29G is connected to the ground pad of the semiconductor device. In the case where the first conductivity type and the second conductivity type are an N-type and a P-type, respectively, the electrode 29G is connected to the power pad of the semiconductor device. Also, in the case where the first conductivity type is a P-type, the semiconductor substrate 5 is connected to the ground pad of the semiconductor device, and in the case where the first conductivity type is an N-type, the semiconductor substrate 5 is connected to the power pad of the semiconductor device.

Figure 6:
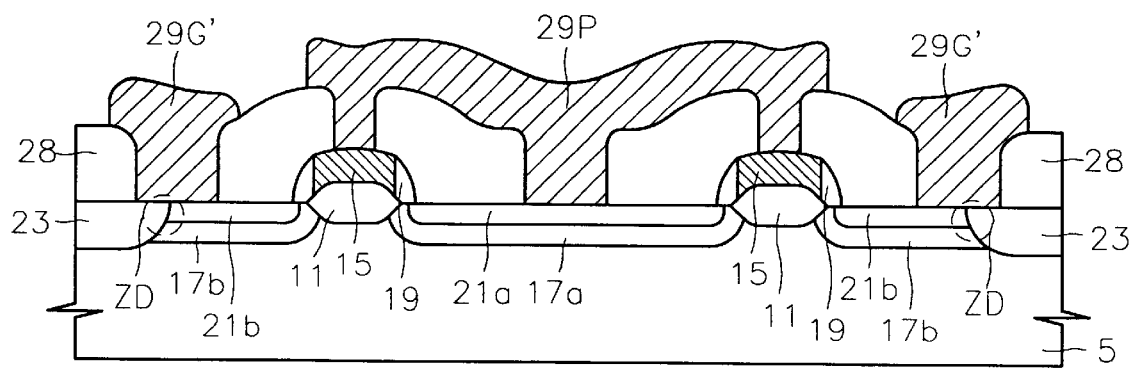
FIG. 6 is a vertical sectional view illustrating another structure in which the electro-static discharge circuit shown in FIG. 1 or 2 is implemented in a semiconductor substrate.

FIG. 6 shows basically the same structure as that shown in FIG. 5, with the exception of an electrode 29G' for electrically connecting the heavily doped source region 21b and the pick-up region 23, thereby constituting a Zener diode ZD.

The operational principles of the structures shown in FIGS. 5 and 6 are the same as those shown in FIGS. 1 and 2, and an explanation thereof will be omitted.

Figure 7:
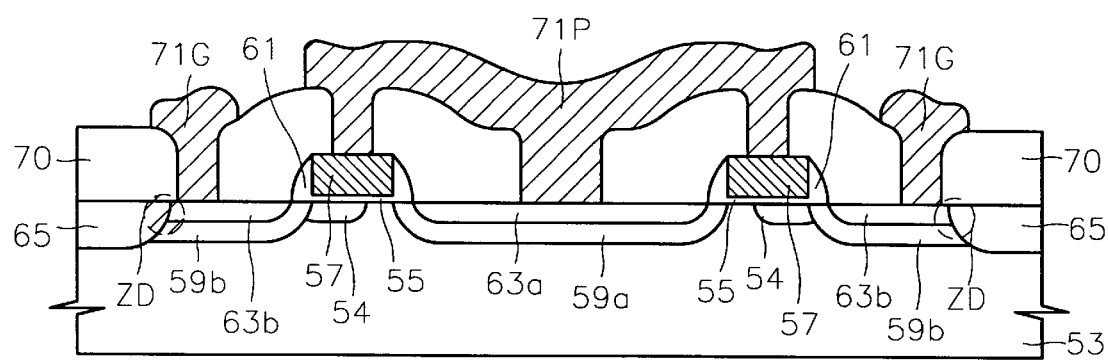
FIG. 7 is a vertical sectional view illustrating still another structure in which the electro-static discharge circuit shown in FIG. 1 or 2 is implemented in a semiconductor substrate.
Figure 8:
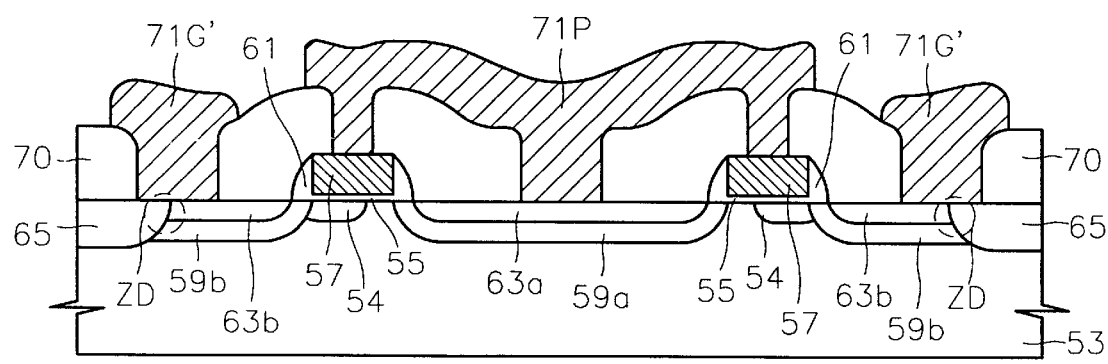
FIG. 8 is a vertical sectional view illustrating still yet another structure in which the electro-static discharge circuit shown in FIG. 1 or 2 is implemented in a semiconductor substrate.

FIGS. 7 and 8 show the structures of the ESD circuits each employing an active transistor, instead of a field transistor as shown in FIGS. 5 and 6. Referring to FIG. 7, an isolation layer (not shown) is formed to define an active region in a predetermined region of a semiconductor substrate 53 of a first conductivity type, and a gate electrode 57 is formed on a predetermined area of the active region. A gate insulation layer 55 is interposed between the gate electrode 57 and the predetermined area of the active region. The first conductivity type semiconductor substrate 53 may be a well of a first conductivity type. A lightly doped drain region 59a of a second conductivity type and a lightly doped source region 59b of the second conductivity type are formed in the semiconductor substrate 53 at both sides of the gate electrode 57, respectively. A heavily doped drain region 63a of the second conductivity type and a heavily doped source region 63b of the second conductivity type are formed at the surfaces of the lightly doped drain region 59a and the lightly doped source region 59b, respectively. Thus, the heavily doped drain region 63a and the heavily doped source region 63b are surrounded by the lightly doped drain region 59a and the lightly doped source region 59b, respectively. The lightly doped drain region 59a and the heavily doped drain region 63a form a drain region, and the lightly doped source region 59b and the heavily doped source region 63b form a source region. The lightly doped source and drain regions 59b and 59a may be simultaneously formed with source and drain regions (not shown) of a high voltage MOS transistor constituting the internal circuit. Also, a spacer 61 may be formed at both side walls of the gate electrode 57. It is preferred that the heavily doped drain region 63a and the heavily doped source region 63b are doped to a concentration high enough to form degenerated impurity regions of the second conductivity type. A degenerated pick-up region 65 of a first conductivity type is formed around the edge of the heavily doped source region 63b. bottom of the pick-up region 65 contacts the semiconductor substrate 53. The heavily doped source region 63b and the pick-up region 65 constitute a Zener diode ZD. The gate electrode 57 and the source and drain regions at both sides of the gate electrode 57 constitute an active transistor. The first conductivity type and the second conductivity type are a P-type or an N-type, respectively, or vice versa. Here, a threshold voltage of the active transistor is higher than an operating voltage of the internal circuit and lower than a drain breakdown voltage of a MOS transistor constituting the internal circuit. Also, a drain breakdown voltage of the active transistor is higher than the operating voltage of the internal circuit. Therefore, it is preferred to form in the semiconductor substrate under the gate electrode 57 a channel region 54 doped with impurities of a first conductivity in an appropriate dose so as to adjust the threshold voltage of the active transistor. Here, preferably, the channel region 54 is spaced a predetermined distance apart from the lightly doped drain region 59a and contacts the lightly doped source region 59b. This is for preventing a junction breakdown voltage of the lightly doped drain region 59a from being lowered.

The semiconductor substrate 53 having the active transistor and the Zener diode ZD is covered with an interlayer dielectric film 70. The heavily doped drain region 63a and the gate electrode 57 are electrically connected to each other by a signal pad electrode 71P through a contact hole produced by etching a predetermined area of the interlayer dielectric film 70. The signal pad electrode 71P is connected to a signal pad (for example, P of FIG. 1 or 2) for applying an electrical signal to the internal circuit of the semiconductor device. The heavily doped source region 63b contacts an electrode 71G through a contact hole produced by etching a predetermined area of the interlayer dielectric film 70. In the case where the first conductivity type and the second conductivity type are a P-type and an N-type, respectively, the electrode 71G is connected to the ground pad of the semiconductor device. In the case where the first conductivity type and the second conductivity type are an N-type and a P-type, respectively, the electrode 71G is connected to the power pad of the semiconductor device. Also, in the case where the first conductivity type is a P-type, the semiconductor substrate 53 is connected to the ground pad of the semiconductor device, and in the case where the first conductivity type is an N-type, the semiconductor substrate 53 is connected to the power pad of the semiconductor device.

FIG. 8 shows basically the same structure as that shown in FIG. 7, with the exception of an electrode 71G' for electrically connecting the heavily doped source region 63b and the pick-up region 65, thereby constituting a Zener diode ZD.

The operational principles of the structures shown in FIGS. 7 and 8 are the same as those shown in FIGS. 1 and 2, and an explanation thereof will be omitted.

Figure 9:
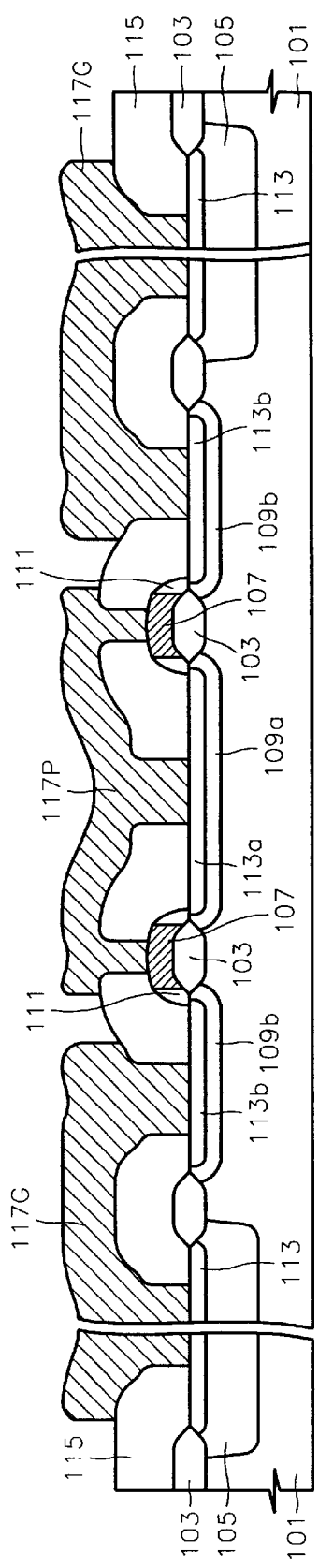
FIG. 9 is a vertical sectional view illustrating a structure in which the electro-static discharge circuit shown in FIG. 3 or 4 is implemented in a semiconductor substrate.
Figure 10:
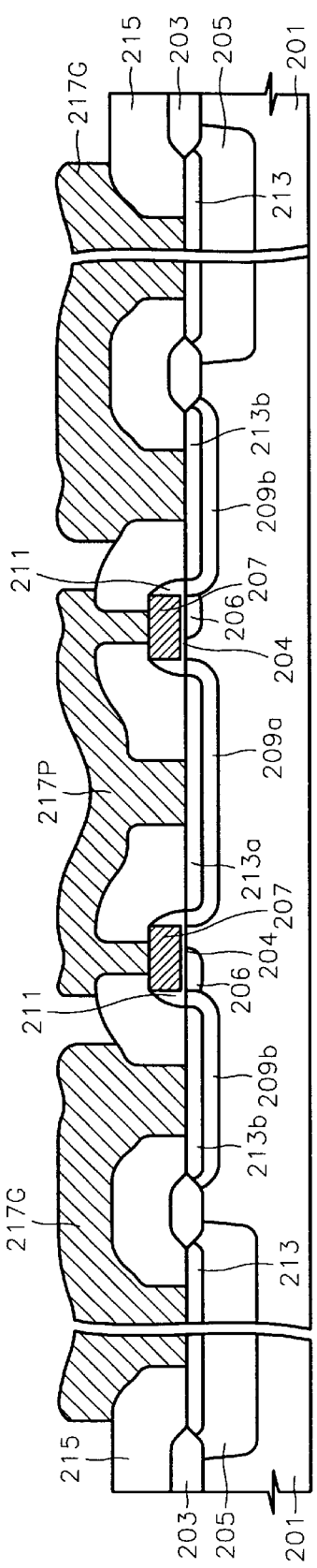
FIG. 10 is a vertical sectional view illustrating another structure in which the electrostatic discharge circuit shown in FIG. 3 or 4 is implemented in a semiconductor substrate.

FIGS. 9 and 10 are vertical sectional views illustrating structures in which the electro-static discharge circuit shown in FIG. 3 or 4 is implemented in a semiconductor substrate, in which a plurality of MOS transistors connected to a plurality of signal pads share a common diode. Referring to FIG. 9, a well region 105 of a second conductivity type is formed in a predetermined area of a semiconductor substrate 101 of a first conductivity type. A field transistor is formed in the semiconductor substrate 101 around the well region 105 of a second conductivity type. The field transistor is comprised of a gate electrode 107, a source region of the second conductivity and a drain region of the second conductivity type. An isolation layer 103 is interposed between the gate electrode 107 and the semiconductor substrate 101. The drain region and the source region are disposed in the semiconductor substrate at both sides of the gate electrode 107. The drain region is comprised of a lightly doped drain region 109a of the second conductivity type and a heavily doped drain region 113b of the second conductivity type surrounded by the lightly doped drain region 109a. The source region is comprised of a lightly doped source region 109b of the second conductivity type and a heavily doped source region 113b of the second conductivity type surrounded by the lightly doped source region 109b. A spacer 111 may be formed at both side walls of the gate electrode 107. A well pick-up region 113 of the second conductivity type surrounded by the well region 105 of the second conductivity type is formed on the well region 105. The well pick-up region 113 may be simultaneously formed with the heavily doped source and drain regions 113b and 113a. The well region 105 of the second conductivity type and the semiconductor substrate 101 of the first conductivity type constitute a common diode (for example, DD of FIG. 3 or 4). Here, the first conductivity type and the second conductivity type are a P-type or an N-type, respectively, or vice versa. A threshold voltage of the field transistor is higher than an operating voltage of the internal circuit and lower than a drain breakdown voltage of a MOS transistor constituting the internal circuit. Also, a drain breakdown voltage of the field transistor is higher than the operating voltage of the internal circuit.

The semiconductor substrate 101 having the field transistor and the common diode is covered with an interlayer dielectric film 115. The heavily doped drain region 113a and the gate electrode 107 are electrically connected to each other by a signal pad electrode 117P through a contact hole produced by etching a predetermined area of the interlayer dielectric film 115. The signal pad electrode 117P is connected to a signal pad (for example, one of P1 through Pn of FIG. 3 or 4) for applying an electrical signal to the internal circuit of the semiconductor device. The heavily doped source region 113b and the well pick-up region 113 are electrically connected to each other by an electrode 117G through a contact hole produced by etching a predetermined area of the interlayer dielectric film 115. In the case where the first conductivity type and the second conductivity type are a P-type and an N-type, respectively, the semiconductor substrate 101 is connected to the ground pad of the semiconductor device. In the case where the first conductivity type and the second conductivity type are an N-type and a P-type, respectively, the semiconductor substrate 101 is connected to the power pad of the semiconductor device.

FIG. 10 shows basically the same structure as that shown in FIG. 9, with the exception of using active transistors. Referring to FIG. 10, a well region 205 of a second conductivity type is formed in a predetermined region of a semiconductor substrate 201 of a first conductivity type. An active transistor is provided in the semiconductor substrate 201 around the well region 205. The active transistor is comprised of a gate electrode 207, a source region of the second conductivity type and a drain region of the second conductivity type. A gate insulation layer 204 is interposed between the gate electrode 207 and the semiconductor substrate 201, and the drain and source regions are disposed in the semiconductor substrate at both sides of the gate electrode 207. The drain region consists of a lightly doped drain region 209a of the second conductivity type and a heavily doped drain region 213a of the second conductivity type surrounded by the lightly doped drain region 209a. The source region is comprised of a lightly doped source region 209b of the second conductivity type and a heavily doped source region 213b of the second conductivity type surrounded by the lightly doped source region 209b. A spacer 211 may be formed at both side walls of the gate electrode 207. A well pick-up region 213 of the second conductivity type is formed on and surrounded by the well region 205 of the second conductivity type. The well pick-up region 213 may be simultaneously formed with the heavily doped source and drain regions 213b and 213a. Here, the well region 205 of the second conductivity type and the semiconductor substrate 201 of the first conductivity type constitute a common diode (for example, DD of FIG. 3 or 4). The first conductivity type and the second conductivity type are a P-type or an N-type, respectively, or vice versa. Here, a threshold voltage of the active transistor is higher than an operating voltage of the internal circuit and lower than a drain breakdown voltage of a MOS transistor constituting the internal circuit. Also, a drain breakdown voltage of the active transistor is higher than the operating voltage of the internal circuit.

Therefore, it is preferred to form a channel region 206 in the semiconductor substrate under the gate electrode 207 in order to adjust the threshold voltage of the active transistor. The channel region 206 is preferably doped with impurities of the first conductivity, that is, the same conductivity type as that of the semiconductor substrate 201, and is spaced a predetermined distance apart from the lightly doped drain region 209a. This is for preventing a junction breakdown voltage of the lightly doped drain region 209a from being lowered, like the channel region shown in FIG. 7.

The semiconductor substrate 201 having the active transistor and the common diode is covered with an interlayer dielectric film 215. The heavily doped drain region 213a and the gate electrode 207 are electrically connected to each other by a signal pad electrode 217P through a contact hole produced by etching a predetermined area of the interlayer dielectric film 215. The signal pad electrode 217P is connected to a signal pad (for example, one of P1 through Pn of FIG. 3 or 4) for applying an electrical signal to the internal circuit of the semiconductor device. The heavily doped source region 213b and the well pick-up region 213 are electrically connected to each other by an electrode 217G through a contact hole produced by etching a predetermined area of the interlayer dielectric film 215. In the case where the first conductivity type and the second conductivity type are a P-type and an N-type, respectively, the semiconductor substrate 201 is connected to the ground pad of the semiconductor device. In the case where the first conductivity type and the second conductivity type are an N-type and a P-type, respectively, the semiconductor substrate 201 is connected to the power pad of the semiconductor device.

The operational principles of the structures shown in FIGS. 9 and 10 are the same as those shown in FIGS. 3 and 4, and an explanation thereof will be omitted.

A junction area of the common diode shown in FIG. 9 or 10 is preferably wider than that of a junction diode of a conventional ESD circuit. Since the common diode is shared by a plurality of signal pads in a ESD circuit, the characteristics of the ESD circuit can be improved without an increase in the chip area of a semiconductor device. For example, assuming that a junction area of a diode connected to a signal pad in a conventional ESD circuit is $50\,\mu m^2$, even if a junction area of a common diode in the present invention, which is shared by 10 signal pads and about 500 $\mu m^2$, is wider than that of the conventional ESD circuit, an increase in the chip area of the semiconductor device can be prevented in the present invention. Also, the junction area of the common diode of the present invention is increased by about 10 times so that the density of ESD current flowing through the common diode is noticeably reduced. Accordingly, even if a high voltage (for example, several hundreds to several thousands volts) higher than the operating voltage of the internal circuit is applied to a signal pad, damage to the junction of the common diode can be substantially reduced.

FIGS. 11 through 14 and FIG. 15A are vertical sectional views illustrating a method for fabricating the structure of the electro-static discharge circuit shown in FIG. 5. FIG. 15B illustrates, associating with FIGS. 11 through 14, a method for fabricating the structure of the electro-static discharge circuit shown in FIG. 6.

Figure 11:
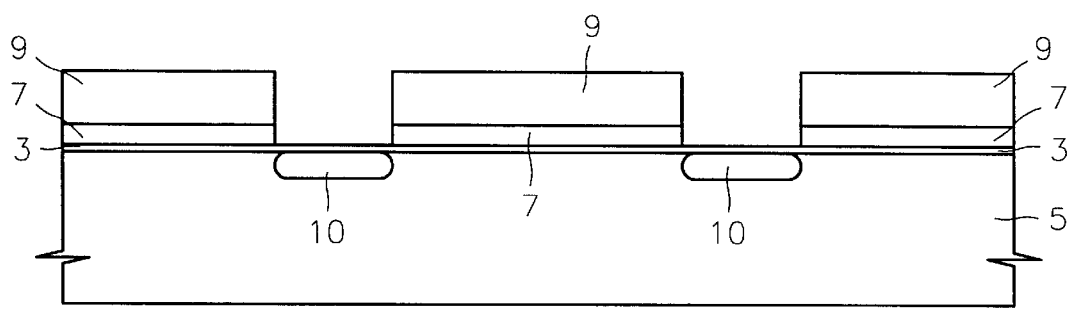
FIGS. 11 through 14 and FIG. 15A are vertical sectional views illustrating a method for fabricating the structure of the electro-static discharge circuit shown in FIG. 5.

Referring to FIG. 11, an initial oxide layer 3 is formed on a semiconductor substrate of a first conductivity type, e.g., a P-type semiconductor substrate, to a thickness of about 500 Å. P-type impurities, e.g., boron ions, are implanted into the semiconductor substrate having the initial oxide layer 3 at an energy of 100 KeV and at a dose of $7.0 \times 10^{12}$ ion atoms/cm$^2$. The semiconductor substrate doped with the P-type impurities is thermally treated at a temperature of about 1150° C. for 6 hours to form a well region 5 of the first conductivity type, i.e., a P-well region. The well region 5 of the first conductivity type may be a semiconductor substrate doped with P-type impurities at an appropriate dose. After the thermal treatment is performed, a silicon nitride layer 7 is formed on the initial oxide layer 3. A photoresist pattern 9 exposing a predetermined area of the silicon nitride layer 7 is formed on the silicon nitride layer 7. The exposed silicon nitride layer 7 is etched by using the photoresist pattern 9 as an etching mask to expose a predetermined area of the initial oxide layer 3. Subsequently, P-type impurities, e.g., boron ions, are implanted into the semiconductor substrate at an energy of 40 KeV and at a dose of $5.0 \times 10^{13}$ ion atoms/cm$^2$, using the photoresist pattern 9 as an ion implantation mask. As a result, a field channel region 10 is formed in the semiconductor substrate under the exposed initial oxide layer 3. The field channel region 10 is formed for adjusting a threshold voltage of a field transistor to be formed in a subsequent process.

Figure 12:
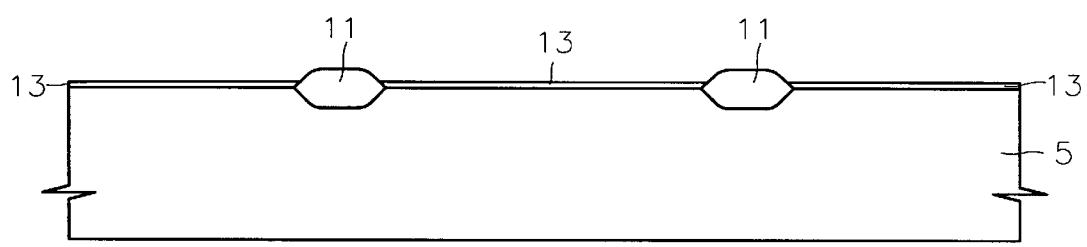

Referring to FIG. 12, the photoresist pattern 9 is removed and the resultant structure having the patterned silicon nitride layer 7 is thermally oxidized to form an isolation layer 11, that is, a field oxide layer, having a thickness of about 5000 Å in the area where the initial oxide layer 3 is exposed. After the patterned silicon nitride layer 7 is removed, P-type impurities, e.g., BF$_2$ ions, are implanted into the surface of the active region between the isolation layers 11, at an energy of 80 KeV and at a dose of $3.0 \times 10^{12}$ ion atoms/cm$^2$. The BF$_2$ ion implantation process is performed for the purpose of adjusting a threshold voltage of a MOS transistor constituting an internal circuit (not shown). The initial oxide layer 3 is removed to expose the active region and a gate insulation layer 13 is formed on the exposed active region. The gate insulation layer 13 is formed of a thermal oxide layer having a thickness of about 300 Å. The gate insulation layer 13 is simultaneously formed with a gate insulation layer of a MOS transistor which constitutes the internal circuit.

Figure 13:
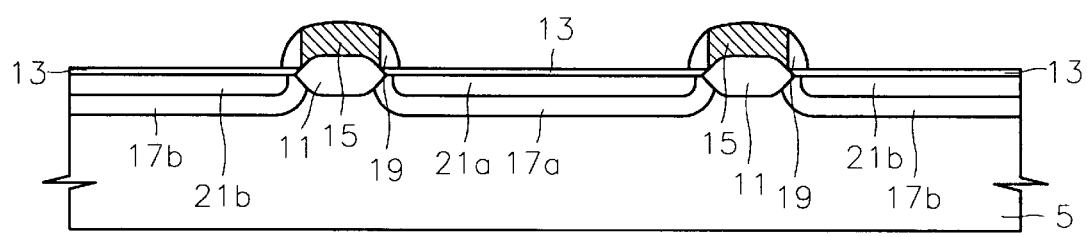

Referring to FIG. 13, a conductive layer, e.g., a tungsten polycide layer comprised of an N-type polysilicon layer and a tungsten silicide layer, is formed over the entire surface of the semiconductor substrate having the gate insulation layer 13. The N-type polysilicon layer and the tungsten silicide layer, are formed to thicknesses of 2000 Å and 1500 Å, respectively. The tungsten polycide layer is patterned to form a gate electrode 15 on the isolation layer 11. Impurities of a second conductivity type, that is, N-type impurities, are implanted into the active regions at both sides of the gate electrode 15, thereby forming a lightly doped drain region 17a of the second conductivity type and a lightly doped source region 17b of the second conductivity type. Preferably, the lightly doped source and drain regions 17b and 17a of the second conductivity type are doped with phosphorus ions at an energy of 120 KeV and at a dose of $6.0 \times 10^{12}$ ion atoms/cm$^2$. Here, only the lightly doped drain region 17a of the second conductivity type may be selectively formed. Next, a CVD oxide layer is formed over the entire surface of the resultant structure having the lightly doped source and drain regions 17b and 17a, to a thickness of about 1500 Å. The resultant structure having the CVD oxide layer is thermally treated at a temperature of about 1000° C. for 100 minutes, thereby diffusing impurities into the lightly doped source and drain regions 17b and 17a. Next, the CVD oxide layer is anisotrophically etched to form a spacer 19 at both side walls of the gate electrode 15. The process for forming the spacer 19 may be omitted. Impurities of the second conductivity type, e.g., As ions, are implanted into the lightly doped source and drain regions 17b and 17a, using the spacer 19 and the gate electrode 15 as ion implantation masks. As a result, heavily doped source and drain regions 21b and 21a are formed. The heavily doped drain region 21a is surrounded by the lightly doped drain region 17a, and the heavily doped source region 21b is surrounded by the lightly doped source region 17b. Here, the heavily doped source and drain regions 21b and 21a are doped with impurities to a concentration high enough to be degenerated.

Figure 14:
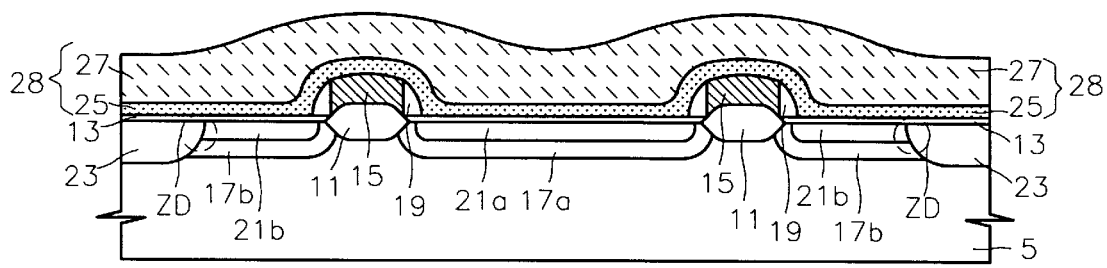

Referring to FIG. 14, impurities of the first conductivity type, e.g., boron ions, are implanted into the edges of the heavily doped source region 21b to form a pick-up region of the first conductivity type contacting the heavily doped source region 21b. The pick-up region 23 is doped to a concentration high enough to be degenerated. The bottom of the pick-up region 23 is formed to contact the semiconductor substrate 5. The heavily doped source region 21b and the pick-up region 23 constitute a Zener diode ZD. The lightly doped drain region 17a and the heavily doped drain region 21a form a drain region, and the lightly doped source region 17b and the heavily doped source region 21b form a source region. The gate electrode 15 and the source and drain regions constitute a field transistor. A first interlayer dielectric film 25 and a second interlayer dielectric film 27 are sequentially formed over the entire surface of the semiconductor substrate having the field transistor and the Zener diode ZD. The first interlayer dielectric film 25 is preferably formed of an undoped oxide layer, e.g., a high temperature oxide layer (HTO), and the second interlayer dielectric film 27 is preferably formed of a BPSG layer having excellent planarization characteristics. The first and second interlayer dielectric films 25 and 27 constitute an interlayer dielectric film 28.

Figure 15A:
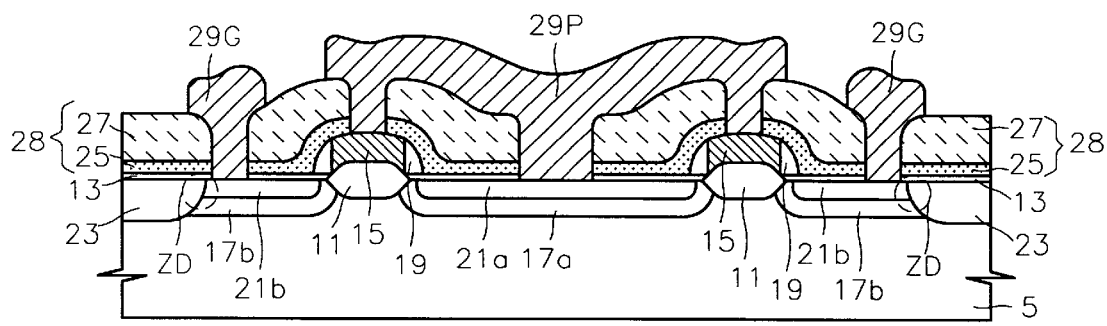
Figure 15B:
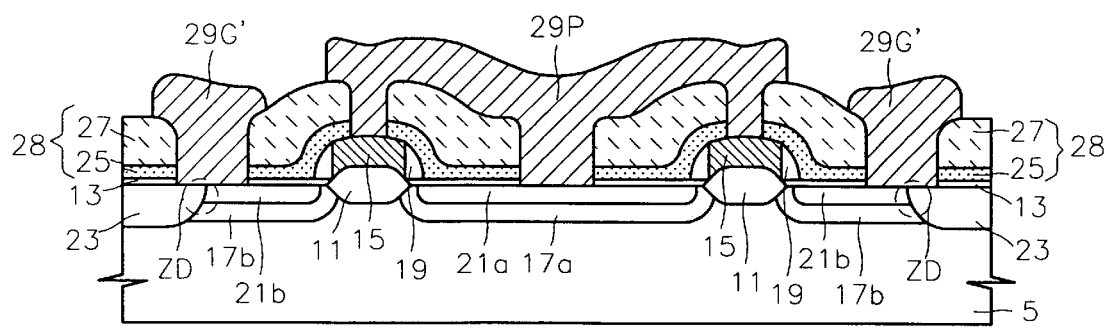
FIG. 15B illustrates, associating with FIGS. 11 through 14, a method for fabricating the structure of the electro-static discharge circuit shown in FIG. 6.

Referring to FIG. 15A, the interlayer dielectric film 28 is patterned to form contact holes exposing the heavily doped drain region 21a, the gate electrode 15 and the heavily doped source region 21b. A conductive layer, preferably a metal layer made of aluminum, is formed over the entire surface of the semiconductor substrate having the contact holes. The conductive layer is patterned to form a signal pad electrode 29P which connects the heavily doped drain region 21a and the gate electrode 15 and to simultaneously form an electrode 29G which contacts the heavily doped source region 21b. The signal pad electrode 29P is connected to a signal pad (for example, P of FIG. 1 or 2) of a semiconductor device, and the electrode 29G and the semiconductor substrate 5 are connected to the ground pad.

In the case where the first conductivity type and the second conductivity type are an N-type and a P-type, respectively, the electrode 29G and the semiconductor substrate 5 are connected to the power pad.

FIG. 15B is a sectional view illustrating an alternative version of the structure shown in of FIG. 15A. Referring to FIG. 15B, a field transistor, a Zener diode ZD and an interlayer dielectric film 28 are formed on the semiconductor substrate 5 of a first conductivity type in the same manner as that shown in FIGS. 11 through 14. Subsequently, the interlayer dielectric film 28 is patterned to form contact holes exposing the heavily doped drain region 21a, the gate electrode 15, the heavily doped source region 21b and the pick-up region 23. A conductive layer, e.g., a metal layer made of aluminum, is formed over the entire surface of the semiconductor substrate having the contact holes. The conductive layer is patterned to form a signal pad electrode 29P which connects the heavily doped drain region 21a and the gate electrode 15 and to simultaneously form an electrode 29G' which connects the heavily doped source region 21b and the pick-up region 23. The signal pad electrode 29P is connected to a signal pad (for example, P of FIG. 1 or 2) of a semiconductor device, and the electrode 29G' and a semiconductor substrate are connected to the ground pad.

In the case where the first conductivity type and the second conductivity type are an N-type and a P-type, respectively, the electrode 29G' are connected to the power pad.

FIGS. 16 through 18 and FIG. 19A are vertical sectional views illustrating a method for fabricating the structure of the electro-static discharge circuit shown in FIG. 7. FIG. 19B illustrates, associating with FIGS. 16 through 18, a method for fabricating the structure of the electro-static discharge circuit shown in FIG. 8.

Figure 16:
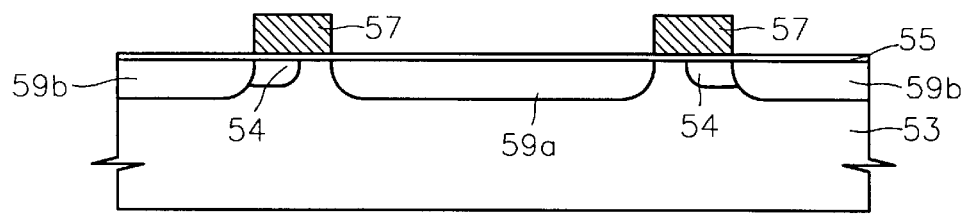
FIGS. 16 through 18 and FIG. 19A are vertical sectional views illustrating a method for fabricating the structure of the electro-static discharge circuit shown in FIG. 7.

Referring to FIG. 16, impurities of a first conductivity type are implanted into the surface of a semiconductor substrate of the first conductivity type, e.g., a P-type semiconductor substrate 53, to form a channel ion implantation region 54. The channel ion implantation region 54 is formed for adjusting a threshold voltage of an active transistor to be formed in a subsequent process, so that the threshold voltage is higher than the operating voltage of the internal circuit. Here, as shown in FIG. 16, the channel ion implantation region 54 is selectively formed in a predetermined area of the semiconductor substrate 53, maintaining a constant distance from a lightly doped drain region to be formed in a subsequent process. This is for adjusting a junction breakdown voltage between the lightly doped drain region and the semiconductor substrate 53, so that the breakdown voltage is higher than a predetermined voltage, specifically the operating voltage of the internal circuit. The P-type semiconductor substrate 53 may correspond to the well region 5 of a first conductivity type shown in FIG. 11, that is, a P-type well region. A gate insulation layer 55 is formed on the semiconductor substrate having the channel ion implantation region 54. The gate insulation layer 55 is formed in the same manner as the gate insulation layer 13 shown in FIG. 12. A conductive layer, e.g., a tungsten polycide layer, is formed on the gate insulation layer 55 and patterned to form a gate electrode 57 on a predetermined area of the gate insulation layer 55. Impurities of a second conductivity type, e.g., N-type impurities, are implanted into the semiconductor substrate, using the gate electrode 57 as an ion implantation mask, to form a lightly doped drain region 59a of the second conductivity type and a lightly doped source region 59b of the second conductivity type in the semiconductor substrate at both sides of the gate electrode 57. The lightly doped source and drain regions 59b and 59a of the second conductivity type are formed in the same manner as those shown in FIG. 13.

Figure 17:
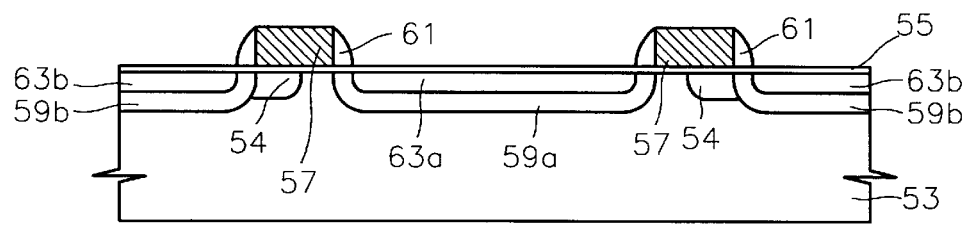

Referring to FIG. 17, a spacer 61 is formed at both side walls of the gate electrode 57 in the conventional manner. The spacer 61 is formed in the same manner as that shown in FIG. 13. Impurities of the second conductivity type are implanted into the lightly doped source and drain regions 59b and 59a using the gate electrode 57 and the spacer 61 as ion implantation masks to form heavily doped source and drain regions 63b and 63a of the second conductivity type. The heavily doped source and drain region 63b and 63a are formed in the same manner as that show in FIG. 13 and are surrounded by the lightly doped source and drain regions 59b and 59a, respectively. The heavily doped source and drain regions 63b and 63a are preferably doped to a concentration high enough to be degenerated. The lightly doped drain region 59a and the heavily doped drain region 63a constitute a drain region, and the lightly doped source region 59b and the heavily doped source region 63b constitute a source region. The gate electrode 57 and the source and drain regions constitute an active transistor.

Figure 18:
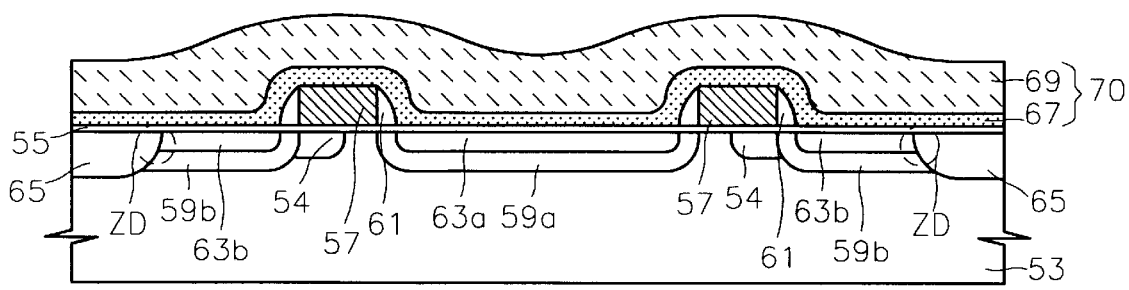

Referring to FIG. 18, impurities of the first conductivity type are implanted into the edges of the heavily doped source regions 63b to form a pick-up region 65 of the first conductivity type contacting the semiconductor substrate 53. The pick-up region 65 is formed in the same manner as the pick-up region 23 shown in FIG. 14. The pick-up region 65 and the heavily doped source region 63b constitute a Zener diode ZD. A first interlayer dielectric film 67 and a second interlayer dielectric film 69 are sequentially formed over the entire surface of the semiconductor substrate having the active transistor and the Zener diode ZD. The first and second interlayer dielectric films are formed in the same manner shown in FIG. 14.

Figure 19A:
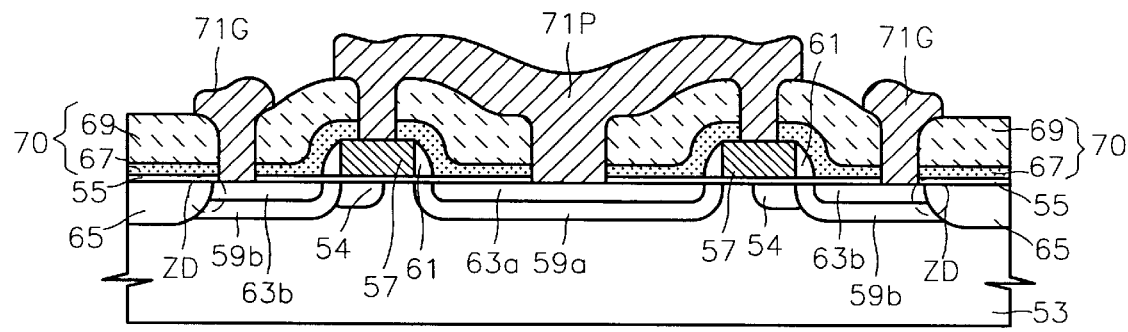
Figure 19B:
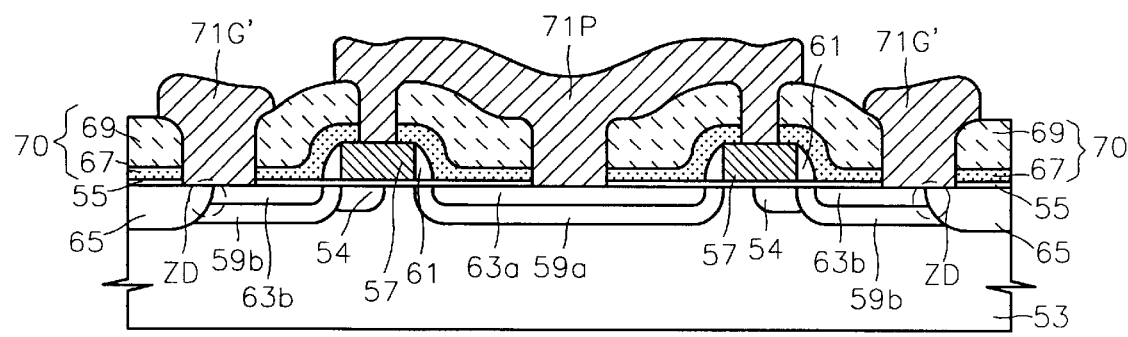
FIG. 19B illustrates, associating with FIGS. 16 through 18, a method for fabricating the structure of the electro-static discharge circuit shown in FIG. 8.
Figure 20:
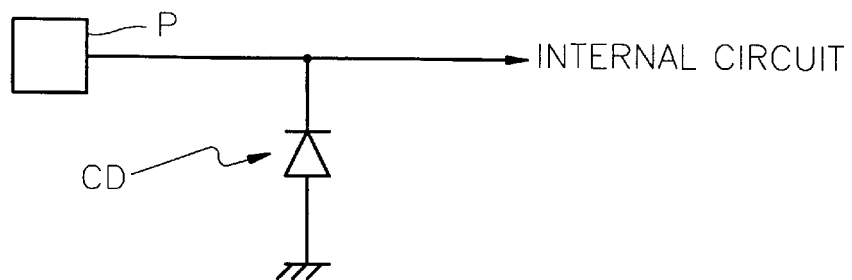
FIG. 20 is an equivalent circuit diagram illustrating a conventional electro-static discharge circuit.

Referring to FIG. 19A, an interlayer dielectric film 70 consisting of the first and second dielectric films 67 and 69 is patterned to form contact holes exposing the heavily doped drain region 63a, the gate electrode 57, and the heavily doped source region 63b. A conductive layer, preferably a metal layer made of aluminum, is formed over the entire surface of the semiconductor substrate having the contact holes. The conductive layer is patterned to form a signal pad electrode 71P which connects the heavily doped drain region 63a and the gate electrode 57 and to simultaneously form an electrode 71G contacting the heavily doped source region 63b. The signal pad electrode 71P is connected to a signal pad (for example, P of FIG. 1 or 2) of the semiconductor device, and the electrode 71G and the semiconductor substrate 53 are connected to the ground pad.

In the case where the first conductivity type and the second conductivity type are an N-type and a P-type, respectively, the electrode 71G and the semiconductor substrate 53 are connected to the power pad.

FIG. 19B is a sectional view illustrating an alternative version of the structure shown in FIG. 19A. Referring to FIG. 19B, an active transistor, a Zener diode ZD and an interlayer dielectric film 70 are formed in the semiconductor substrate 53 of a first conductivity type in the same manner as that shown in FIGS. 16 through 18. Subsequently, the interlayer dielectric film it 70 is patterned to form contact holes exposing the heavily doped drain region 63a, the gate electrode 57, the heavily doped source region 63b and the pick-up region 65. A conductive layer, e.g., a metal layer made of aluminum, is formed over the entire surface of the semiconductor substrate having the contact holes. The conductive layer is patterned to form a signal pad electrode 71P which connects the heavily doped drain region 63a and the gate electrode 57, and to simultaneously form an electrode 71G' which connects the heavily doped source region 63b and the pick-up region 65. The signal pad electrode 71P is connected to a signal pad (for example, P of FIG. 1 or 2) of a semiconductor device, and the electrode 71G' is connected to the ground pad.

In the case where the first conductivity type and the second conductivity type are an N-type and a P-type, respectively, the electrode 71G' and the semiconductor substrate 53 are connected to the power pad.

Figure 21:
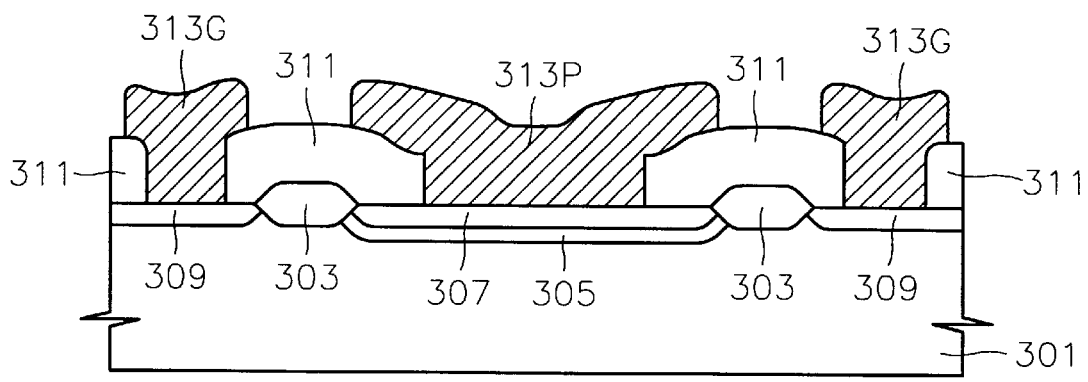
FIG. 21 is a vertical sectional view illustrating a structure in which the electrostatic discharge circuit shown in FIG. 20 is implemented in a semiconductor substrate.
Figure 22:
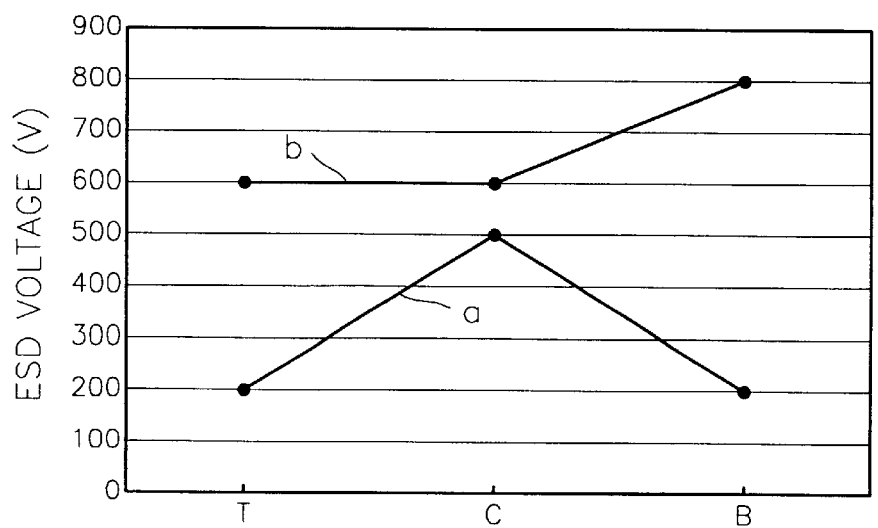
FIG. 22 is a graph showing measured results of electro-static discharge characteristics of the structures according to prior art and the present invention.

FIG. 22 is a graph showing the measured results of electro-static discharge characteristics, that is, ESD voltages, of the structures according to prior art and the present invention, in which the horizontal axis indicates portions of a wafer at which an ESD circuit is positioned, and the vertical axis indicates maximum passed ESD voltages. ESD voltages are measured in a human body mode. In FIG. 22, "T" represents a position opposite to a flat zone of the wafer, "C" represents the center of the wafer and "B" represents a position around the flat zone. The line represented by 'a' indicates data of the prior art, and the line represented by 'b' indicates data of the present invention. The prior art data are results measured in the ESD structure shown in FIG. 21 and the present invention data are results measured in the ESD structure shown in FIG. 6. The internal circuits connected to the ESD structures shown in FIGS. 21 and 6 were used as test patterns each having three inverters. In the prior art ESD structure shown in FIG. 21, the junction area of an N-type impurity region was 5077 $\mu m^2$ and the junction area of the drain region shown in FIG. 6 was 3870 $\mu m^2$.

Referring to FIG. 22, the maximum ESD voltage of the conventional ESD structure was in the range of 200 to 500 volts, and that of the ESD structure according to the present invention was in the range of 600 to 800 volts. Therefore, even if the junction area of an ESD structure of the present invention is smaller than that in the prior art, the ESD characteristics of the present invention are improved.

As described above, according to the present invention, an ESD circuit is implemented by using a MOS transistor (either a field transistor or an active transistor) having a threshold voltage higher than an operating voltage of an internal circuit, and a Zener diode, thereby by-passing a large amount of tunneling current through the Zener diode when a voltage higher than the operating voltage of the internal circuit is applied to a signal pad. Accordingly, damage to a drain junction of the MOS transistor directly connected to the signal pad can be minimized. Also, ESD characteristics can be enhanced without an increase in the chip area of a semiconductor device by employing a common diode shared by a plurality of signal pads and having a large junction area, instead of using a Zener diode for each pad. In particular, according to the present invention, the ESD characteristics of a high voltage semiconductor device can be further enhanced.

The present invention is not limited to the above-described embodiments and various modifications which may occur to those skilled in the art without departing from the true spirit and scope of the invention as defined by the appended claims. For example, lightly doped source and drain regions 17a, 17b, 59a, 59b, 109a, 109b, 209a and 209b shown in FIGS. 5 through 10 may be omitted in the present invention. In FIGS. 5 through 10, the respective source and drain regions may consist of only heavily doped source and drain regions.

What is claimed is:

1. An electro-static discharge (ESD) circuit of a semiconductor device having an electrical signal pad, an internal circuit, and a known potential, the ESD circuit comprising:

at least one MOS transistor having a gate electrode and a drain region which are connected to the electrical signal pad; and a Zener diode connected in series between a source region of the at least one MOS transistor and the known potential, wherein when an abnormal signal is applied to the at least one electrical signal pad, the at least one MOS transistor becomes active and the Zener diode is reversely biased to allow a tunneling current to flow through the Zener diode to protect the internal circuit from the abnormal signal.

2. The ESD circuit according to claim 1, wherein the at least one electrical signal pad is connected to an input terminal of the internal circuit.

3. The ESD circuit according to claim 1, wherein the at least one MOS transistor includes at least one NMOS transistor which becomes active when the abnormal signal is higher than an operating voltage of the internal circuit.

4. The ESD circuit according to claim 3, wherein each of the at least one NMOS transistor is one of a field transistor and an active transistor.

5. The ESD circuit according to claim 3, wherein a P-type region and an N-type region of the Zener diode are connected to a ground potential and a source region of the at least one NMOS transistor, respectively.

6. The ESD circuit according to claim 3, wherein a bulk region of the at least one NMOS transistor is connected to a ground potential.

7. The ESD circuit according to claim 3, wherein a threshold voltage of the at least one NMOS transistor is higher than the operating voltage of the internal circuit, lower than a drain junction breakdown voltage of a MOS transistor in the internal circuit, and lower than a drain junction breakdown voltage of the at least one NMOS transistor.

8. The ESD circuit according to claim 1, wherein the at least one MOS transistor includes at least one PMOS transistor which becomes active when the abnormal signal is lower than a threshold voltage of the at least one PMOS transistor.

9. The ESD circuit according to claim 8, wherein each of the at least one PMOS transistor is one of a field transistor and an active transistor.

10. The ESD circuit according to claim 8, wherein an N-type region and a P-type region of the Zener diode are connected to a power potential and a source region of the at least one PMOS transistor, respectively.

11. The ESD circuit according to claim 8, wherein a bulk region of the at least one PMOS transistor is connected to a power potential.

12. The ESD circuit according to claim 8, wherein the threshold voltage of the at least one PMOS transistor is higher than an operating voltage of the internal circuit, lower than a drain junction breakdown voltage of a MOS transistor in the internal circuit, and lower than a drain junction breakdown voltage of the at least one PMOS transistor.

13. An electrostatic discharge (ESD) circuit of a semiconductor device having a plurality of electrical signal pads, a plurality of internal circuits, and a known potential, the ESD circuit comprising:

MOS transistors each having a gate electrode and a drain region which are connected to a respective one of the electrical signal pads; and a common diode connected in series between a source region of each of the MOS transistors and the known potential, wherein when an abnormal signal is applied to at least one of the electrical signal pads, at least one of the MOS transistors associated with the at least one of the electrical signal pads becomes active and the common diode is reversely biased to allow a reverse breakdown current to flow through the common diode to protect at least one of the internal circuits associated with the at least one of the MOS transistors from the abnormal signal.

14. The ESD circuit according to claim 13, wherein each of the electrical signal pads is connected to an input terminal of a respective one of the internal circuits.

15. The ESD circuit according to claim 13, wherein the MOS transistors include NMOS transistors which become active when the abnormal signal is higher than an operating voltage of internal circuits respectively associated with the NMOS transistors.

16. The ESD circuit according to claim 15, wherein each of the NMOS transistors is one of a field transistor and an active transistor.

17. The ESD circuit according to claim 15, wherein a P-type region and an N-type region of the common diode are connected to a ground potential and a source region of each of the NMOS transistors, respectively.

18. The ESD circuit according to claim 15, wherein a bulk region of each of the NMOS transistors is connected to a ground potential.

19. The ESD circuit according to claim 15, wherein a threshold voltage of the respective NMOS transistors is higher than the operating voltage of each of the internal circuits respectively associated with the NMOS transistors, lower than a drain junction breakdown voltage of each of MOS transistors in the respective internal circuits, and lower than a drain junction breakdown voltage of the respective NMOS transistors.

20. The ESD circuit according to claim 13, wherein the MOS transistors include PMOS transistors which become active when the abnormal signal is lower than a threshold voltage of the respective PMOS transistors.

21. The ESD circuit according to claim 20, wherein each of the PMOS transistors is one of a field transistor and an active transistor.

22. The ESD circuit according to claim 20, wherein a P-type region and an N-type region of the common diode are connected to a source region of each of the PMOS transistors and a power potential, respectively.

23. The ESD circuit according to claim 20, wherein a bulk region of each of the PMOS transistors is connected to a power potential.

24. The ESD circuit according to claim 20, wherein the threshold voltage of the respective PMOS transistors is higher than an operating voltage of each of the internal circuits respectively associated with the PMOS transistors, lower than a drain junction breakdown voltage of each of MOS transistors in the respective internal circuits, and lower than a drain junction breakdown voltage of the respective PMOS transistors.

25. An electro-static discharge (ESD) structure of a semiconductor device comprising:
a gate electrode formed on a predetermined area of a semiconductor substrate of a first conductivity type;
a lightly doped source region of a second conductivity type and a lightly doped drain region of the second conductivity type, the lightly doped source and drain regions being formed in the semiconductor substrate at both sides of the gate electrode, respectively;
a heavily doped degenerated source region of the second conductivity type surrounded by the lightly doped source region, and a heavily doped degenerated drain region of the second conductivity type surrounded by the lightly doped drain region; and
a degenerated pick-up region of the first conductivity type contacting edges of the heavily doped degenerated source region and the semiconductor substrate.

26. The ESD structure according to claim 25, further comprising an isolation layer interposed between the gate electrode and the semiconductor substrate.

27. The ESD structure according to claim 25, further comprising a gate insulation layer interposed between the gate electrode and the semiconductor substrate.

28. The ESD structure according to claim 25, wherein the first conductivity type and the second conductivity type are a P-type and an N-type, respectively.

29. The ESD structure according to claim 25, wherein the first conductivity type and the second conductivity type are an N-type and a P-type, respectively.

30. The ESD structure according to claim 25, further comprising spacers at both side walls of the gate electrode.

31. The ESD structure according to claim 28, further comprising:
a signal pad electrode contacting the heavily doped drain region and the gate electrode; and
a ground pad electrode contacting the heavily doped source region.

32. The ESD structure according to claim 28, further comprising:
a signal pad electrode contacting the heavily doped drain region and the gate electrode; and
a ground pad electrode contacting the heavily doped source region and the pick-up region.

33. The ESD structure according to claim 29, further comprising:
a signal pad electrode contacting the heavily doped drain region and the gate electrode; and
a power pad electrode contacting the heavily doped source region.

34. The ESD structure according to claim 29, further comprising:
a signal pad electrode contacting the heavily doped drain region and the gate electrode; and
a power pad electrode contacting the heavily doped source region and the pick-up region.

35. An electro-static discharge (ESD) structure of a semiconductor device comprising:
a gate electrode formed on a predetermined area of a semiconductor substrate of a first conductivity type;
a lightly doped source region of a second conductivity type and a lightly doped drain region of the second conductivity type, the lightly doped source and drain regions being formed in the semiconductor substrate at both sides of the gate electrode, respectively;
a heavily doped source region of the second conductivity type surrounded by the lightly doped source region and a heavily doped drain region of the second conductivity type surrounded by the lightly doped drain region;
a well region of the second conductivity type formed in the semiconductor substrate around the lightly doped source region;
a well pick-up region of the second conductivity type surrounded by the well region of the second conductivity type;
a signal pad electrode for electrically connecting the heavily doped drain region and the gate electrode; and
an interconnection for electrically connecting the heavily doped source region and the well pick-up region.

36. The ESD structure according to claim 35, further comprising an isolation layer interposed between the gate electrode and the semiconductor substrate.

37. The ESD structure according to claim 35, further comprising a gate insulation layer interposed between the gate electrode and the semiconductor substrate.

38. The ESD structure according to claim 35, wherein the first conductivity type and the second conductivity type are a P-type and an N-type, respectively.

39. The ESD structure according to claim 35, wherein the first conductivity type and the second conductivity type are an N-type and a P-type, respectively.

40. The ESD structure according to claim 35, further comprising spacers at both side walls of the gate electrode.

41. A method for fabricating an electro-static discharge (ESD) structure of a semiconductor device comprising the steps of:

forming a gate electrode on a predetermined area of a semiconductor substrate of a first conductivity type;

forming a lightly doped source region of a second conductivity type and a lightly doped drain region of the second conductivity type in the semiconductor substrate at both sides of the gate electrode, respectively;

forming a heavily doped degenerated source region of the second conductivity type surrounded by the lightly doped source region, and a heavily doped degenerated drain region of the second conductivity type surrounded by the lightly doped drain region; and forming a degenerated pick-up region of the first conductivity type contacting edges of the heavily doped degenerated source region and the semiconductor substrate.

42. The method according to claim 41, wherein the first conductivity type and the second conductivity type are a P-type and an N-type, respectively.

43. The method according to claim 41, wherein the first conductivity type and the second conductivity type are an N-type and a P-type, respectively.

44. The method according to claim 42, further comprising the steps of forming a signal pad electrode contacting the heavily doped drain region and the gate electrode, and forming a ground pad electrode contacting the heavily doped source region.

45. The method according to claim 42, further comprising the steps of forming a signal pad electrode contacting the heavily doped drain region and the gate electrode, and forming a ground pad electrode contacting the heavily doped source region and the pick-up region.

46. The method according to claim 43, further comprising the steps of forming a signal pad electrode contacting the heavily doped drain region and the gate electrode, and forming a power pad electrode contacting the heavily doped source region.

47. The method according to claim 43, further comprising the steps of forming a signal pad electrode contacting the heavily doped drain region and the gate electrode, and forming a power pad electrode contacting the heavily doped source region and the pick-up region.

48. The method according to claim 41, further comprising the step of forming an isolation layer between the gate electrode and the semiconductor substrate.

49. The method according to claim 41, further comprising the step of forming a gate insulation layer between the gate electrode and the semiconductor substrate.

* * * * *